(12) United States Patent
Qin et al.

(10) Patent No.: US 6,728,112 B1
(45) Date of Patent: Apr. 27, 2004

(54) FASTENING MODULE FOR PRINTED CIRCUIT BOARD OF PORTABLE ELECTRONIC DEVICE

(75) Inventors: ShuiYuan Qin, Shenzhen (CN); Yun Hsian Liao, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/421,226

(22) Filed: Apr. 22, 2003

(30) Foreign Application Priority Data

Jan. 29, 2003 (TW) .......................... 92201636 U

(51) Int. Cl.[7] .................... H05K 5/00; H05K 5/04; H05K 5/06; H05K 1/14; H05K 7/00
(52) U.S. Cl. .................. 361/759; 361/740; 361/741; 361/747; 361/756
(58) Field of Search .................. 361/683–686, 361/724–732, 740–742, 747, 752, 753, 756, 758, 759, 799–802, 804, 807, 814, 816, 818; 174/35 R, 35 MS, 50, 50.52; 439/607, 608, 939; 312/223.1, 223.2; 211/41.17

(56) References Cited

U.S. PATENT DOCUMENTS

| 4,912,602 A | * | 3/1990 | Zurek et al. ................ 361/752 |
| 5,268,820 A | * | 12/1993 | Tseng et al. ................ 361/785 |
| 6,005,775 A | * | 12/1999 | Chiu .......................... 361/752 |
| 6,111,760 A | | 8/2000 | Nixon |

* cited by examiner

Primary Examiner—Phuong T. Vu
(74) Attorney, Agent, or Firm—Wei Te Chung

(57) ABSTRACT

A fastening module (1) for a printed circuit board (10) of a portable electronic device includes the printed circuit board and a casing (20). The casing includes at least one supporting plate (23, 25) and at least one clamp (22). The supporting plate and the clamp engage with the printed circuit board, thus fixing the printed circuit board in the casing.

3 Claims, 5 Drawing Sheets

FASTENING MODULE FOR PRINTED CIRCUIT BOARD OF PORTABLE ELECTRONIC DEVICE

BACKGROUND OF THE INVENTION

1. Field of the Invention

The present invention relates to a fastening mechanism, and particularly to a fastening module for fastening a printed circuit board in a portable electronic device.

2. Description of Related Art

In a conventional portable electronic device, such as a mobile phone, the printed circuit board thereof is only sandwiched between two enclosures of the portable electronic device and is only fixed when the portable electronic device is assembled. U.S. Pat. No. 6,111,760 discloses such a fastening means wherein multiple layers of electronic components, including a printed circuit board, are secured within a wireless communications device by two different portions of the device's enclosure gripping the component layers therebetween, thereby preventing substantial vertical movement of the component layers within the combined housing. However, if the two different portions of the device's enclosure slightly loosen, the printed circuit board will become loose and electronic contact between the board and other components will be weakened. Furthermore, the printed circuit board cannot be fastened in place until the two different portions of the device's enclosure are assembled together, and the printed circuit board will become unfixed if the two different portions of the device's enclosure are disassembled. In its unfixed condition, the printed circuit board can be easily damaged. Furthermore, it is inconvenient to assemble and disassemble the device since the printed circuit board is not fixedly attached to one side or the other of the enclosure.

Therefore, an improved fastening means for a printed circuit board of a portable electronic device is desired which overcomes the disadvantages of the prior art.

SUMMARY OF THE INVENTION

A main object of the present invention is to provide a reliable fastening module for a printed circuit board of a portable electronic device.

A fastening module for a printed circuit board of a portable electronic device includes the printed circuit board and a casing, wherein the casing comprises at least one supporting plate and at least one clamp, and the supporting plate and the clamp engage with the printed circuit board, thus fastening the printed circuit board in the casing.

Other objects, advantages and novel features of the invention will become more apparent from the following detailed description of a preferred embodiment thereof when taken in conjunction with the accompanying drawings, wherein:

DETAILED DESCRIPTION OF THE INVENTION

Figure 1:
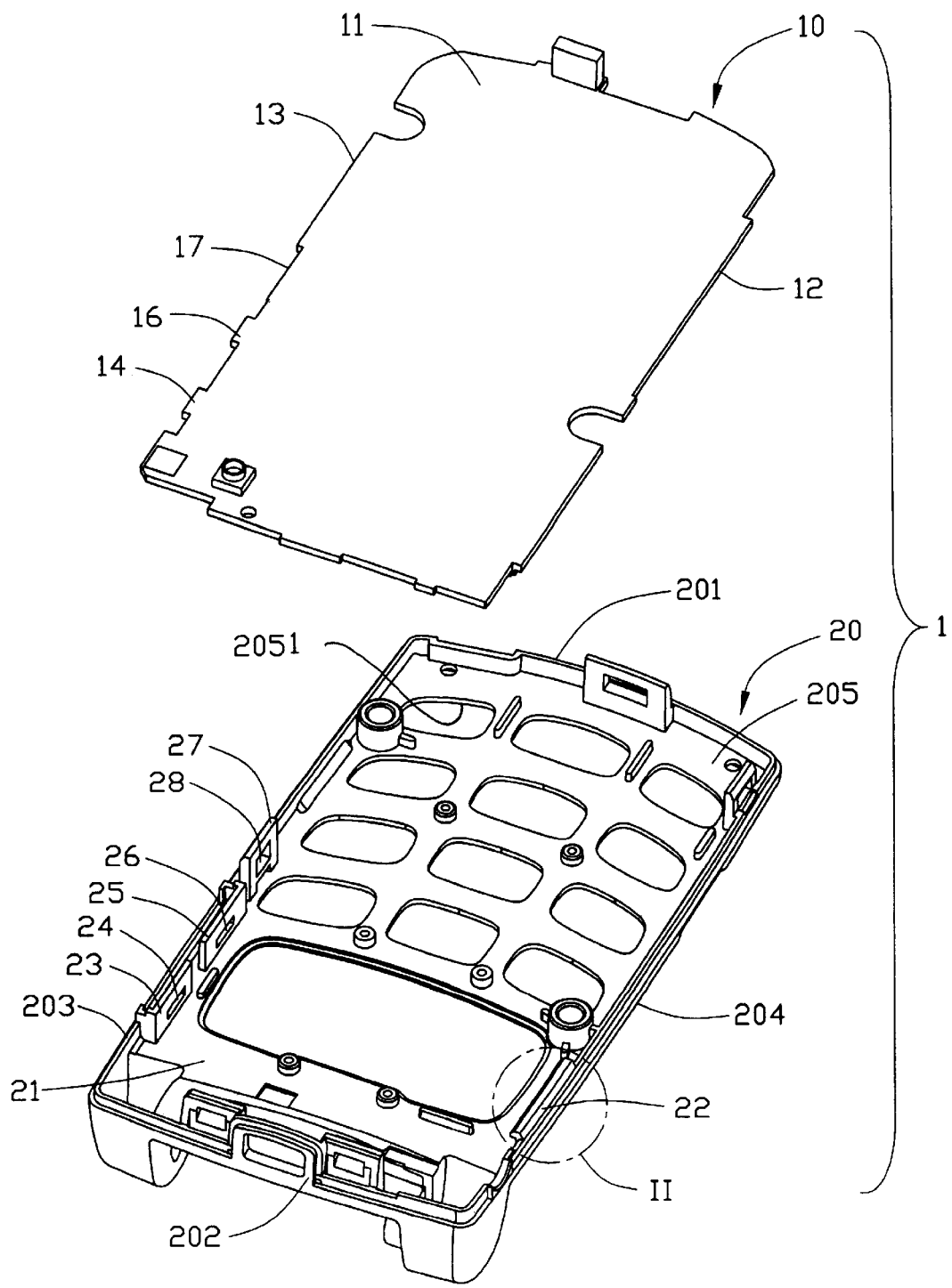
FIG. 1 is a disassembled view of a fastening module in accordance with a preferred embodiment of the present invention.

Referring now to the drawings in detail, FIG. 1 shows a fastening module 1 for a printed circuit board 10 of a mobile phone. The fastening module 1 includes the printed circuit board 10 and a casing 20. A first and a second protruding lip 14, 16 perpendicularly extend from a first lateral face 13 of the printed circuit board 10, and a recess 17 is defined adjacent to the second protruding lip 16. The casing 20 includes a front wall 202, a rear wall 201, a left wall 203, a right wall 204 and a bottom wall 205. The bottom wall defines a plurality of openings 2051 for extension of a plurality of keypads (not shown) therethrough. The right wall 204 includes an outer horizontal section 2041 and an inner vertical section 2042. The five walls 201 to 205 define a receiving space 21 therebetween for receiving the printed circuit board 10. Three supporting plates 23, 25, 27 extend upwardly from the bottom wall 205 and parallel to the left wall 203 of the casing 20. Openings 24, 26, 28 are respectively defined through the supporting plates 23, 25, 27. The first and second supporting plates 23, 25 support and fix the printed circuit board 10 using the first and second openings 24, 26 therethrough to respectively hold the first and second protruding lips 14, 16 of the printed circuit board 10. The third supporting plate 27 and the third opening 28 are used for fixing other elements, e.g., the bottom cover (not shown) of the mobile phone. Understandably, that not-shown bottom cover includes a side wall vertically positioned on the bottom section 2041 and laterally outside of the vertical section 2042. A clamp 22 is formed on the right wall 204 of the casing 20.

Figure 2:
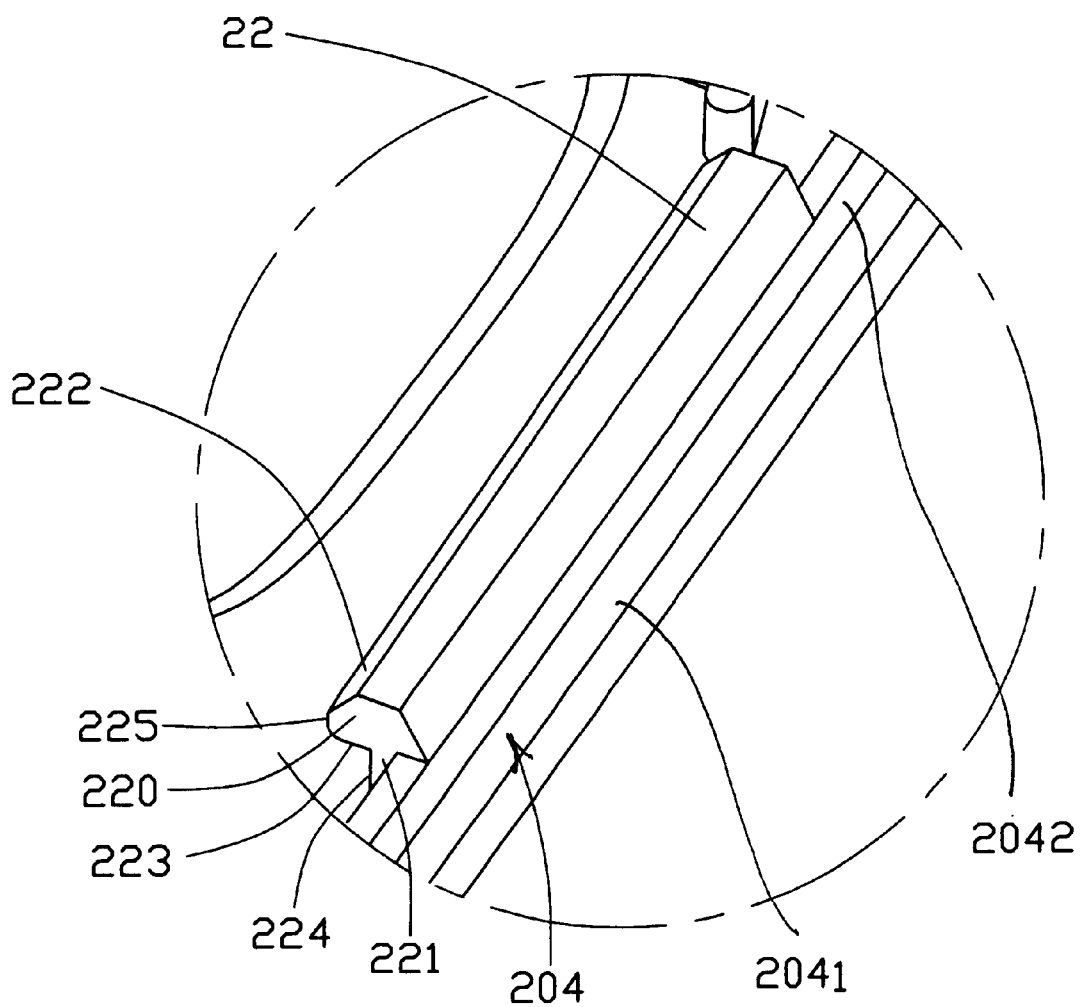
FIG. 2 is an enlarged view of the portion II of FIG. 1.

FIG. 2 is an enlarged view of the clamp 22. The clamp 22 has a substantially T-shaped cross-section and comprises a cap portion 220 and a bottom portion 221. The bottom portion 221 is located against the vertical section 2042 of the right wall 204 and inside the receiving space 21, and the cap portion 220 stands just above the vertical section 2042 of the right wall 204. The clamp 22 has a first inclined surface 222 and an adjacent second inclined surface 225 and a first blocking surface 223 on the cap portion 220. The bottom portion 221 has a second blocking surface 224.

Figure 3:
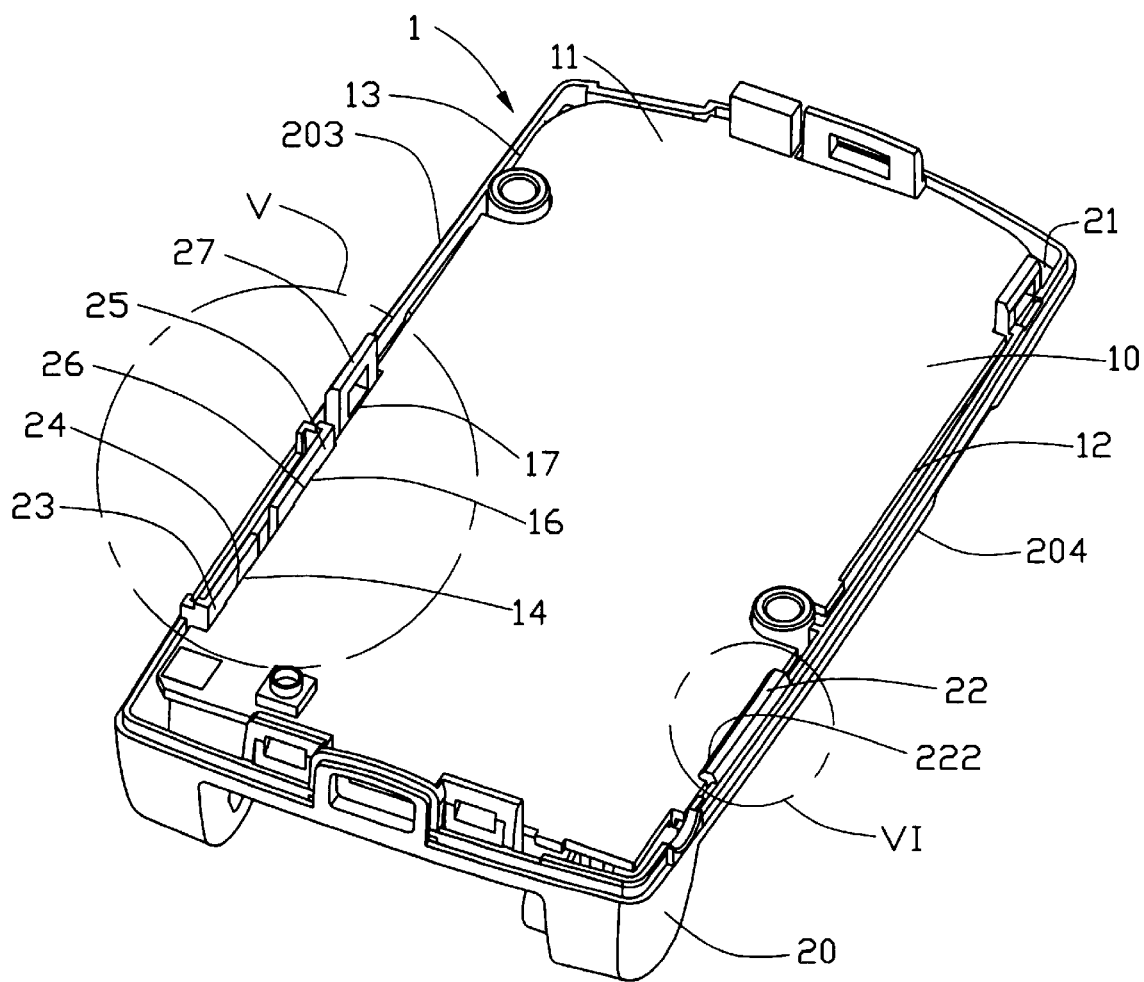
FIG. 3 is an assembled view of the fastening module of FIG. 1.
Figure 4:
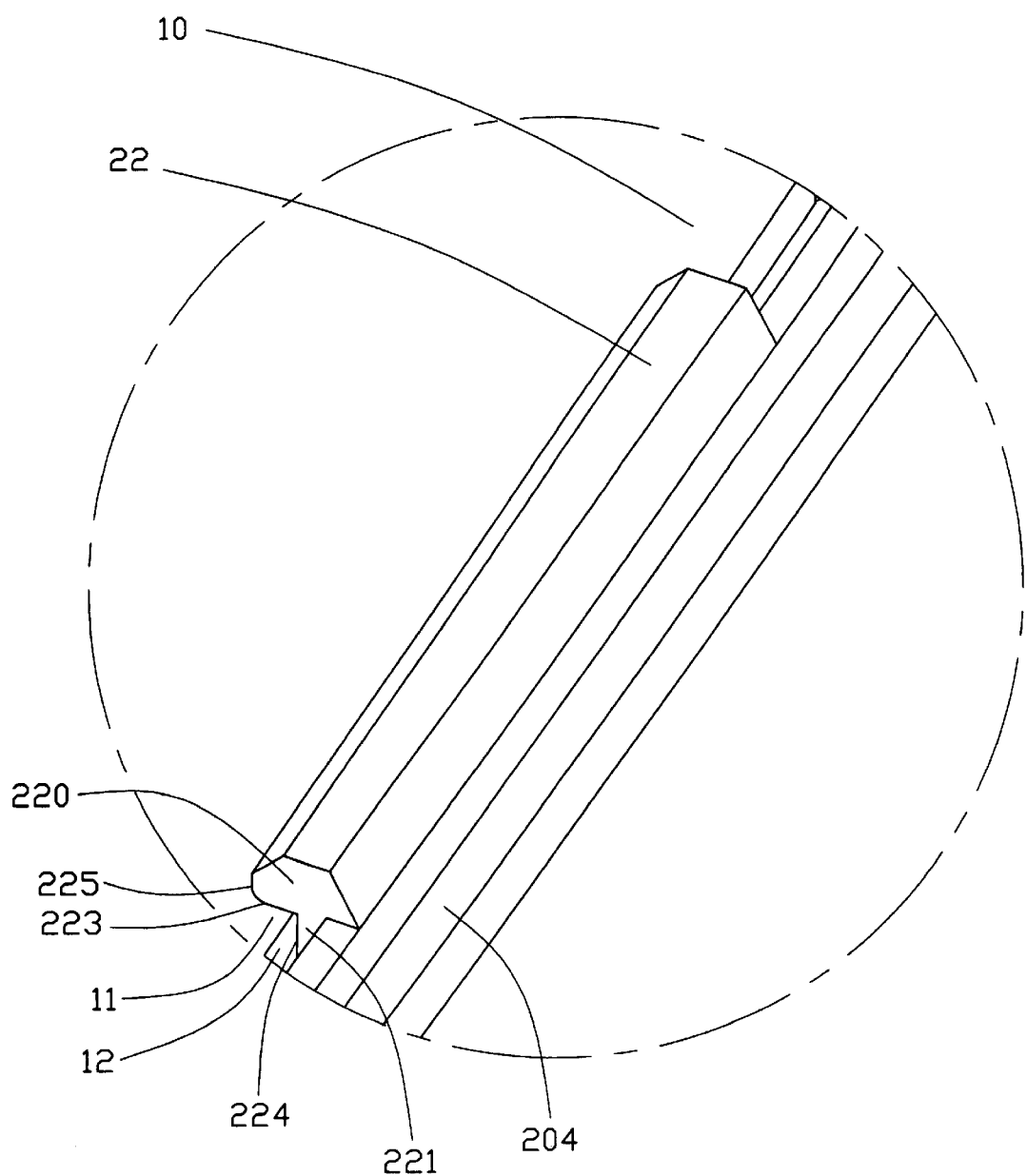
FIG. 4 is an enlarged view of the portion IV of FIG. 3.
Figure 5:
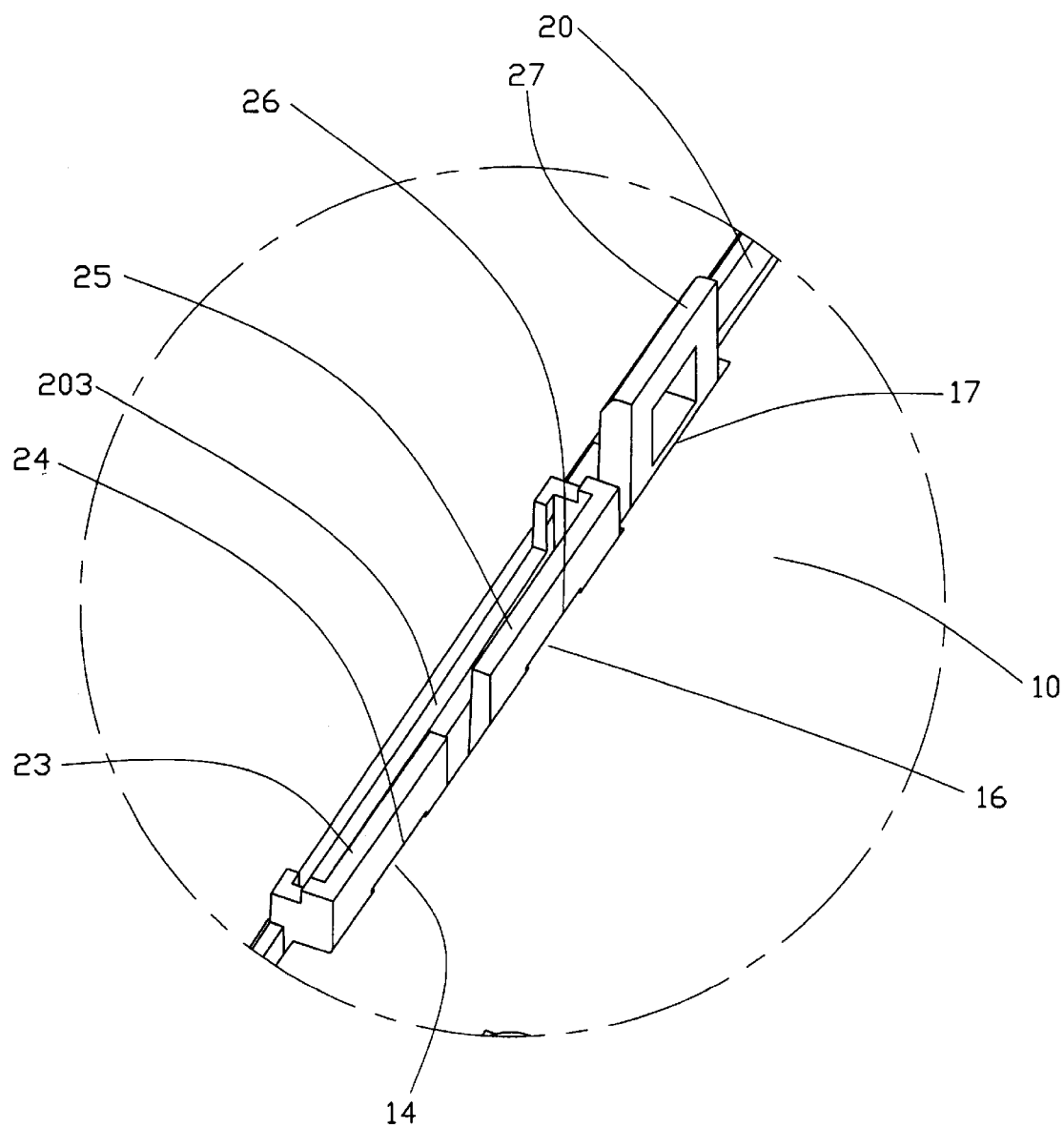
FIG. 5 is an enlarged view of the portion V of FIG. 3.

FIGS. 3 to 5 show the fastening module 1 when assembled. The printed circuit board 10 is received and fastened in the receiving space 21 of the casing 20. The clamp 22 grips the printed circuit board 10, and the supporting plates 23, 25 respectively fix the protruding lips 14, 16 in the openings 24, 26, so that a top surface 11 of the printed circuit board 10 is fixed beneath the first blocking surface 223 of the clamp 22, and a second lateral face 12 is restrained by the second blocking surface 224 of the clamp 22. The third supporting plate 27 is received in the recess 17 of the printed circuit board 10. When assembling the fastening module 1, the protruding lips 14, 16 are first inserted into the openings 24, 26, and the supporting plate 27 is received in the recess 17. The assembly person then presses the printed circuit board 10 downwardly, so that the printed circuit board 10 slides downwardly along the first inclined surface 222 of the clamp 22 and is restrained from moving by the clamp 22. To disassemble the fastening module 1, the printed circuit board 10 is grasped at the side of the clamp 22 and is lightly turned upwardly, so that the printed circuit board 10 is released from the clamp 22 by means of the flexibility of the printed circuit board 10 itself, with the second lateral face 12 of the printed circuit board 10 sliding upwardly along the second inclined surface 225 of the clamp 22. The protruding lips 14, 16 are then pulled out from the openings 24, 26, detaching the printed circuit board 10 from the casing 20.

Other elements, such as a keypad, can be sandwiched between the printed circuit board 10 and the casing 20 when the fastening module 1 is assembled. A mobile phone can be constructed by combining the fastening module 1 of the present invention with a battery, using a front cover, a back cover, LCD modules, and other related elements in means known in the art, such as screwing. Since the printed circuit board 10 is fastened before complete assembly, assembly and disassembly of the mobile phone is very convenient and the printed circuit board 10 is preserved undamaged. Furthermore, if the front cover and the back cover of the mobile phone loosen from one another, the electronic contact between the printed circuit board 10 and other components inside the mobile phone will hardly be affected since the printed circuit board 10 is tightly fixed in the casing 20 of the mobile phone.

In the present invention, other engagement means can be used to fix the printed circuit board 10 in the casing 20, in place of the protruding lips 14, 16 being held in the openings 24, 26 of the supporting plates 23, 25. For example, at least one clip could be formed along the first lateral face 13 of the printed circuit board 10 for grasping the supporting plates 23, 25 or for grasping the left wall 203 of the casing 20.

Additionally, the supporting plates 23, 25 and the clamp 22 can be formed on other walls of the casing 20, and only one or a plurality of protruding lips or clamps may be used for fastening the printed circuit board 10 in the casing 20 of the mobile phone.

The fastening module 1 of the present invention can also be used in other electronic devices, such as in personal digital assistants, for fastening a printed circuit board therein.

When the front and back covers of a portable electronic device incorporating the fastening module 1 therein become loose, the electronic contact between the printed circuit board 10 and other components will hardly be affected since the printed circuit board 10 is tightly fixed in the casing 20 of the portable electronic device. Furthermore, since the printed circuit board 10 is fastened before complete assembly, assembly and disassembly of the portable electronic device is very convenient and the printed circuit board 10 is safeguarded from damage.

is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A fastening module for a printed circuit board of a portable electronic device comprising:

a printed circuit board; and a casing;

wherein said casing comprising at least one supporting plate and at least one clamp, said supporting plate and clamp engaging with said printed circuit board, thereby fixing said printed circuit board in the casings;

wherein said printed circuit board has at least one protruding means engaging with said supporting plate wherein said supporting plate defines an opening therethrough, and said protruding means is a protruding lip which is inserted in said opening, wherein said supporting plate and said clamp are positioned on opposite walls of said casing wherein said clamp has a T-shaped configuration and has a cap portion and a bottom portion wherein said cap portion has two adjacent inclined surfaces along which said printed circuit board directly slides downwardly or upwardly respectively during assembly or disassembly of said fastening module, and one blocking surface for restraining movement of the printed circuit board and said bottom portion has one blocking surface for fixing said printed circuit board beneath said clamp.

2. A fastening module for holding a printed circuit board of a portable electronic device comprising:

a casing defining one side wall including an inner vertical section and an outer horizontal section;

a supporting plate, a printed circuit board having at least one protruding means engaging with said supporting plate, wherein said supporting plate defines an opening therethrough and said protruding means is a protruding lip which is inserted in said opening.

a T-shaped clamp formed inside said vertical section and including a bottom portion laterally integrally connected to an interior side of said vertical section and a cap portion located on the bottom portion and vertically integrally connected to said vertical section; and wherein said cap portion has two adjacent inclined surfaces along which said printed circuit board directly slides downwardly or upwardly respectively during assembly and disassembly of said fastening module, and one blocking surface for restraining movement of the printed circuit board and said bottom portion has one blocking surface for fixing said printed circuit board beneath said clamp.

the printed circuit board received in the casing with an edge section laterally abutting against the bottom portion and downwardly pressed by said cap portion.

3. The module as claimed in claim 2, wherein said casing defines a plurality of openings through which a plurality of keypads positioned between the printed circuit board and the casing are accessible from an exterior.

* * * * *